United States Patent
Domanski et al.

(10) Patent No.: US 9,478,979 B2
(45) Date of Patent: Oct. 25, 2016

(54) SEMICONDUCTOR ESD CIRCUIT AND METHOD

(71) Applicant: Infineon Technologies AG, Neubiberg (DE)

(72) Inventors: Krzysztof Domanski, Munich (DE); Wolfgang Soldner, Unterhaching (DE); Cornelius Christian Russ, Diedorf (DE); David Alvarez, Munich (DE); Adrien Ille, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/690,739

(22) Filed: Apr. 20, 2015

(65) Prior Publication Data
US 2015/0229126 A1  Aug. 13, 2015

Related U.S. Application Data

(63) Continuation of application No. 12/987,658, filed on Jan. 10, 2011, now Pat. No. 9,013,842.

(51) Int. Cl.
*H02H 9/00* (2006.01)
*H02H 9/04* (2006.01)
(Continued)

(52) U.S. Cl.
CPC ......... *H02H 9/046* (2013.01); *H01L 27/0285* (2013.01); *H01L 29/0692* (2013.01); *H01L 29/1083* (2013.01)

(58) Field of Classification Search
CPC .......... H02H 9/00; H02H 3/22; H02H 9/046; H02J 9/00; H01L 23/60; H01L 27/0248; H05K 1/0259

USPC ........................................................... 361/56
See application file for complete search history.

(56) References Cited

U.S. PATENT DOCUMENTS 5,255,146 A  10/1993  Miller
5,345,357 A   9/1994  Pianka
(Continued)

FOREIGN PATENT DOCUMENTS

CN      1447427 A     10/2003
DE  102004062205 A1   7/2006

OTHER PUBLICATIONS

Anderson et al., "ESD Protection for Mixed-Voltage I/O Using NMOS Transistors Stacked in a Cascade Configuration," Electrical Overstress/Electrostatic Discharge Symposium Proceedings, Oct. 1998,9 pages.

*Primary Examiner* — Rexford Barnie
*Assistant Examiner* — Joseph Inge
(74) *Attorney, Agent, or Firm* — Slater Matsil, LLP (57) ABSTRACT

In an embodiment, an electrostatic discharge (ESD) circuit for providing protection between a first node and a second node includes a first MOS device having a first source/drain coupled to a first node, and a second source/drain coupled to an intermediate node. The ESD circuit also includes a first capacitor coupled between a gate of the first MOS device and the first node, a first resistor coupled between the gate of the first MOS device the intermediate node, a second MOS device having a first source/drain coupled to the intermediate node, and a second source/drain coupled to the second node, a second capacitor coupled between a gate of the second MOS device and the first node, and a second resistor coupled between the gate of the second MOS device and the second node.

23 Claims, 11 Drawing Sheets

(51) Int. Cl.
  *H01L 27/02* (2006.01)
  *H01L 29/06* (2006.01)
  *H01L 29/10* (2006.01)

(56) References Cited

U.S. PATENT DOCUMENTS

| | | | |
|---|---|---|---|
| 5,631,793 A * | 5/1997 | Ker | H01L 27/0251 361/111 |
| 5,930,094 A | 7/1999 | Amerasekera et al. | |
| 6,078,083 A | 6/2000 | Amerasekera et al. | |
| 6,097,071 A | 8/2000 | Krakauer | |
| 6,125,021 A * | 9/2000 | Duvvury | H01L 27/0251 361/56 |
| 6,140,682 A | 10/2000 | Liu et al. | |
| 6,268,993 B1 | 7/2001 | Anderson | |
| 6,310,379 B1 | 10/2001 | Andresen et al. | |
| 6,353,520 B1 | 3/2002 | Andresen et al. | |
| 6,356,427 B1 | 3/2002 | Anderson | |
| 6,369,998 B1 | 4/2002 | Anderson | |
| 6,388,850 B1 | 5/2002 | Ker et al. | |
| 6,510,033 B1 | 1/2003 | Maloney et al. | |
| 6,534,833 B1 | 3/2003 | Duvvury et al. | |
| 6,535,368 B2 | 3/2003 | Andresen et al. | |
| 6,633,468 B1 | 10/2003 | Duvvury et al. | |
| 6,724,603 B2 | 4/2004 | Miller et al. | |
| 7,184,253 B1 | 2/2007 | Hartranft et al. | |
| 8,059,375 B2 * | 11/2011 | Fehle | H01L 27/0266 361/111 |
| 2006/0226488 A1 | 10/2006 | Schneider et al. | |
| 2007/0103826 A1 * | 5/2007 | Hung | H02H 9/046 361/56 |
| 2008/0043389 A1 | 2/2008 | Fehle et al. | |
| 2008/0049365 A1 | 2/2008 | Worley et al. | |
| 2008/0197415 A1 * | 8/2008 | Yun | H02H 9/046 257/355 |

* cited by examiner

SEMICONDUCTOR ESD CIRCUIT AND METHOD

This is a continuation application of U.S. application Ser. No. 12/987,658, entitled "Semiconductor ESD Circuit and Method," filed on Jan. 10, 2011, which application is hereby incorporated herein by reference in its entirety.

TECHNICAL FIELD

This invention relates generally to semiconductor circuits and methods, and more particularly to a semiconductor ESD protection circuit and method.

BACKGROUND

As electronic components are becoming smaller and smaller along with the internal structures in integrated circuits, it is becoming easier to either completely destroy or otherwise impair electronic components. In particular, many integrated circuits are highly susceptible to damage from the discharge of static electricity. Generally, electrostatic discharge (ESD) is the transfer of an electrostatic charge between bodies at different electrostatic potentials or voltages, caused by direct contact or induced by an electrostatic field. The discharge of static electricity, or ESD, has become a critical problem for the electronics industry.

Device failures resulting from ESD events are not always immediately catastrophic or apparent. Often, the device is only slightly weakened but is less able to withstand normal operating stresses. Such a weakened device may result in reliability problems. Therefore, various ESD protection circuits are typically included in circuits to protect its various components.

Stacked MOS clamping devices are commonly used for ESD protection. These devices typically utilize a stack of one or more MOS devices that are dynamically triggered by a fast ESD transient, but do not conduct current during normal operation. Stacked MOS power clamps are used, for example, in circuits having multiple power domains. For example, one power domain dedicated for I/O circuit may operate using a 3.3V power supply while another power domain dedicated for processing logic may operate at 1.8V using small, fast, low-voltage transistors that breakdown at the higher supply voltage. Generally, supply nodes and I/O pins are protected using stacked MOS clamps to prevent device destruction because of a momentary high voltage.

SUMMARY OF THE INVENTION

In an embodiment, an electrostatic discharge (ESD) circuit for providing protection between a first node and a second node includes a first MOS device having a first source/drain coupled to a first node, and a second source/drain coupled to an intermediate node. The ESD circuit also includes a first capacitor coupled between a gate of the first MOS device and the first node, a first resistor coupled between the gate of the first MOS device the intermediate node, a second MOS device having a first source/drain coupled to the intermediate node, and a second source/drain coupled to the second node, a second capacitor coupled between a gate of the second MOS device and the first node, and a second resistor coupled between the gate of the second MOS device and the second node.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a stacked MOS ESD device. The invention may also be applied, however, to other semiconductor structures.

In an embodiment, RC circuits are used to bias and trigger a stacked MOS ESD power clamp made of NMOS devices T1 and T2. In an embodiment, an RC MOS power clamp has a plurality of stacked MOS along with associated RC trigger circuitry. In one embodiment, the stacked devices are triggered by a plurality RC bridges, coupled to the gates of each device.

Figure 1A:
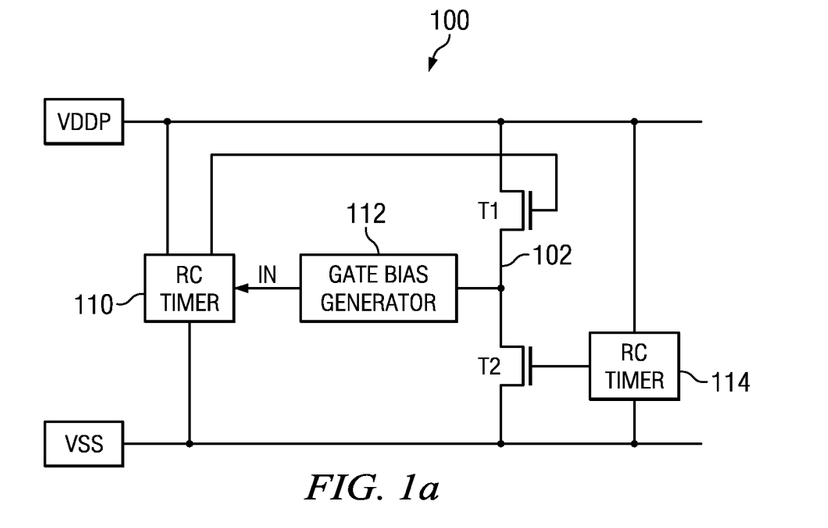
FIGS. 1a-1d illustrate an ESD device according to an embodiment of the present invention.

FIG. 1a illustrates a functional block diagram of ESD device 100 according to an embodiment of the present invention. ESD device 100 has transistor T1 and T2 stacked on one another. During normal operation, T1 and T2 are shut off. During an ESD event, RC timer 110 activates device T1 and RC timer 114 activates device T2, thereby establishing a conductive path between supply VDDP and supply VSS. Gate bias generator 112 supplies a bias voltage for the gate of transistor T1. In one embodiment, transistors T1 and T2 are biased such that the gates of these devices do not exceed a maximum value in order to prevent device degradation or destruction during normal operation and during some ESD events. In some cases, this maximum value is referred to as an Absolute Maximum Ratings voltage. In an embodiment, a self-referenced voltage is used to bias the gates of T1 and T2, and the performance of these devices is optimized with respect to ESD relevant performance parameters.

Figure 1B:
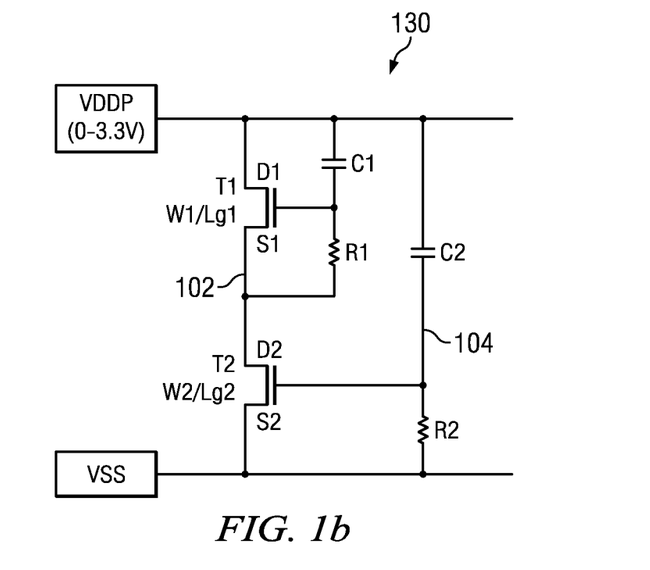

FIG. 1b illustrates a schematic of ESD circuit 130 according to an embodiment of the present invention. ESD circuit 130 has NMOS devices T1 and T2 stacked on top of each other. The drain of T1 is coupled to supply node VDDP, the source of T1 is coupled to the drain of T2, and the source of T2 is coupled to supply node VSS. The gate of T1 is coupled to supply node VDDP via capacitor C1 and to the source of T1 via resistor R1. Similarly, the gate of T2 is coupled to supply node VDDP via capacitor C2 and to the source of T2 via R2. During normal non-ESD operation, both T1 and T2 have their gates biased to their source and are, therefore, shut off. During an ESD transient on node VDDP, however, the gate of T1 is pulled up via capacitor C1 and the gate of T2 is pulled up via capacitor C2, thereby turning on the transistors, which create a low-ohmic current path between supply nodes VDDP and VSS. This current path can occur within the conductive channels of T1 and T2 themselves and/or within parasitic bipolar devices associated with these devices, depending on the embodiment.

In an embodiment, NMOS devices T1 and T2 are both low voltage devices. In one embodiment example, T1 and T2 are each rated for operation at a maximum voltage of 1.8 volts for use with a nominal supply voltage of 3.3 V. It should be appreciated that in alternative embodiments, other technologies, device types, voltage ratings, and power supply voltages can be used for transistors T1 and T2. For example, transistors T1 and T2 can be rated to operate at a higher or lower voltage. Furthermore, transistors T1 and T2 can be PMOS devices or other device types such as DEMOS devices, FINFET devices, bipolar devices or thyristors. In addition, other nominal supply voltages can be used in alternative embodiments. In a further embodiment, further series devices can be placed in series with T1 and T2, where each of the further series devices have trigger circuitry utilizing an intermediate node coupled to the next series device. In an embodiment, this trigger circuitry can contain another instantiation of gate bias generator 112 and RC time 110 (FIG. 1a) or an additional RC circuit similar to R1 and C1 shown in FIG. 1b.

In an embodiment, the RC time constant of resistor R1 and C1, and resistor R2 and C2 are set to between about 100 ns and about 200 ns. Alternatively, the RC time constant can be set to between 10 ns and 1000 ns, or even time constants outside of this range. In one embodiment, the RC time constant is set to be about 150 ns by setting R1 and R2 each to about 100 KR and setting capacitors C1 and C2 each to about 1.5 pF. In such an arrangement, the RC trigger circuit is sensitive to ESD stress having a slew-rate in range of less than 100 ns. Once the stacked MOS devices are turned on, they remain in a low-ohmic state for a time defined by the RC time constant of the trigger circuitry. In some embodiments, this can be in the range of a human body model (HBM) ESD pulse duration lasting about 150 ns. In alternative embodiments, other ranges and values can be used for the RC time constants and for the component values of R1, R2, C1, and C2.

In one embodiment, width W1 and length Lg1 of transistor T1 is set to be the same as width W2 and length Lg2 of transistor T2. By making the size of devices T1 and T2 the same, and by making the RC time constant of R1 and C1 the same as the time constant of R2 and C2, both T1 and T2 remain turned on for about the same time during an ESD event. By operating both devices at the same turn-on time, each device can be made to operate within its rated voltage range. In alternative embodiments, T1 and T2 can be sized different from each other to adjust and/or to optimize performance. Furthermore, the time constant of R1 and C1 and R2 and C2 can be adjusted or modified with respect to each other in alternative embodiments.

Under normal operation, when there is a nominal DC voltage at the supply, capacitance C1 experiences a voltage difference between supply VDDP and intermediate node 102. Since the transistors T1 and T2 have a similar gate width to length ratio, the potential of intermediate node 102 is about VDDP/2. In such an embodiment, transistors T1 and T2 and capacitor C1 can be implemented by devices having voltage specification of less than VDDP because the full supply voltage is not seen across these devices.

Figure 1C:
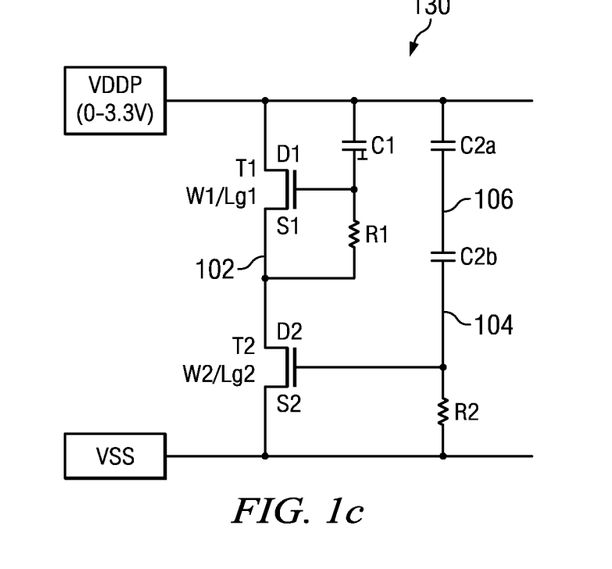

As shown in FIG. 1c, by making capacitor C2 a series combination of two capacitors C2a and C2b, C2 can also be implemented using devices having a voltage specification of less than VDDP. In an embodiment, capacitors C1, a C2a and C2b are implemented using 1.8V NMOS capacitors, where C1 has a nominal value of about 1.5 pF and C2a and C2b each have a nominal value of about 3 pF. Under normal operation with a nominal DC voltage at supply VDDP, series capacitors C2a and C2b make a capacitive voltage divider between supply and ground. In an embodiment, where C2a and C2b are the same value, the potential at node 106 is about VDDP/2. Therefore, capacitors C2a and C2b can be made using devices having a voltage specification of about VDDP/2. In an embodiment, resistors R1 and R2 are implemented using polysilicon resistors. In alternative embodiments, other structures and values can be used for capacitors C1, C2a and C2b and resistors R1 and R2.

In an embodiment, the voltage at intermediate node 102 can be tuned by adjusting the gate width/length ratios of T1 and T2. In one case, if W1/Lg1>W2/Lg2, the bias point at intermediate node 102 can be tuned to higher voltages, whereas for W1/Lg1<W2/Lg2 the voltage at intermediate node 102 can be decreased.

Figure 2A:
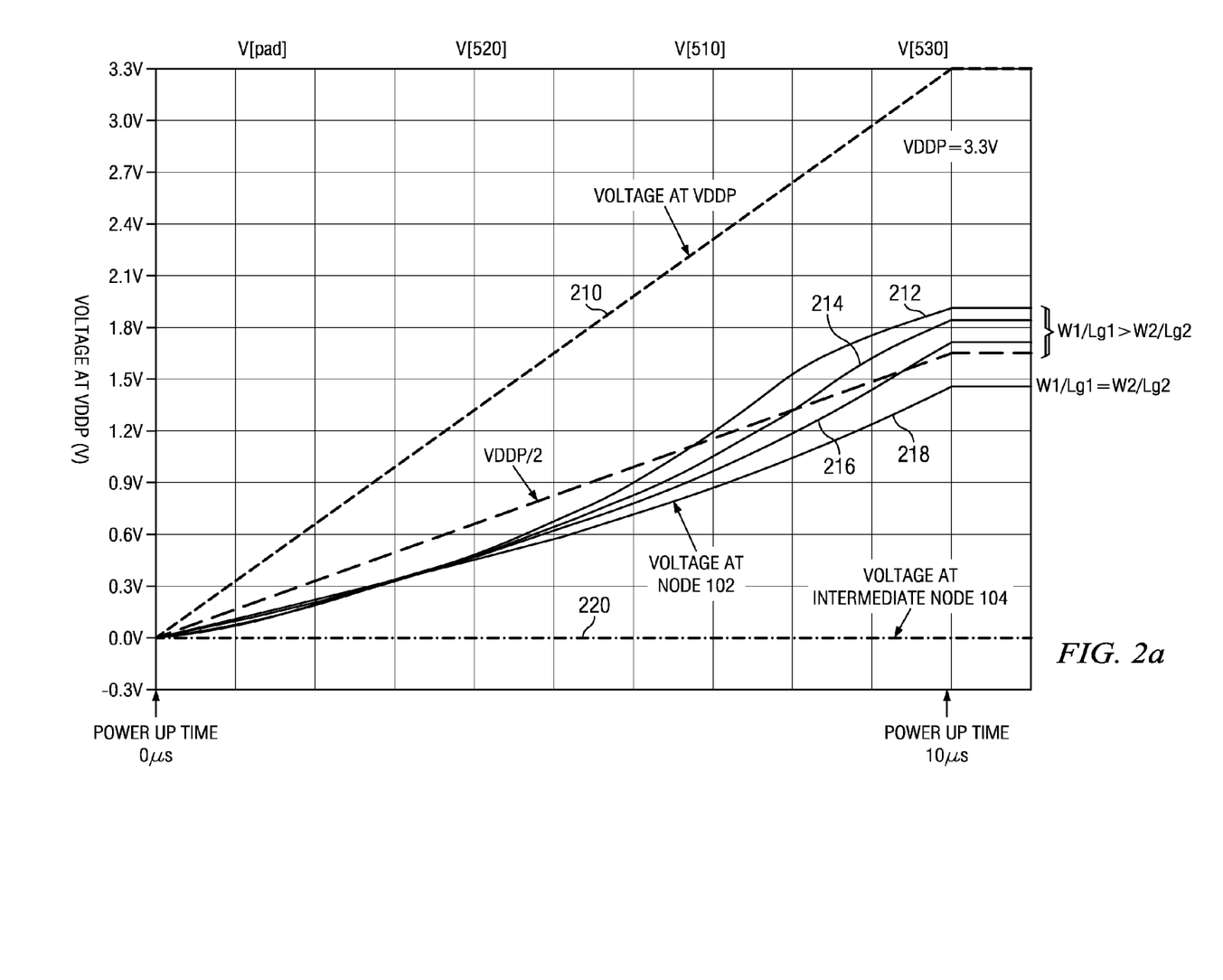
FIGS. 2a-2b illustrate waveform diagrams showing the performance of an embodiment ESD device.

FIG. 2a illustrates a waveform diagram showing the transient behavior of ESD circuit 130 (FIG. 1c) when power supply VDDP is ramped from 0V to 3.3V. Curve 210 represents supply voltage VDDP, curves 212, 214 and 216 represent the voltage at intermediate node 102 for various cases with W1/Lg1>W2/Lg2, curve 218 represents the voltage at intermediate node 102 for W1/Lg1=W2/Lg2, and curve 220 represents the voltage at intermediate node 104. In an embodiment, ratios W1/Lg1 and W2/Lg2 are optimized such that intermediate node 102 assumes a value of VDDP/2.

Figure 2B:
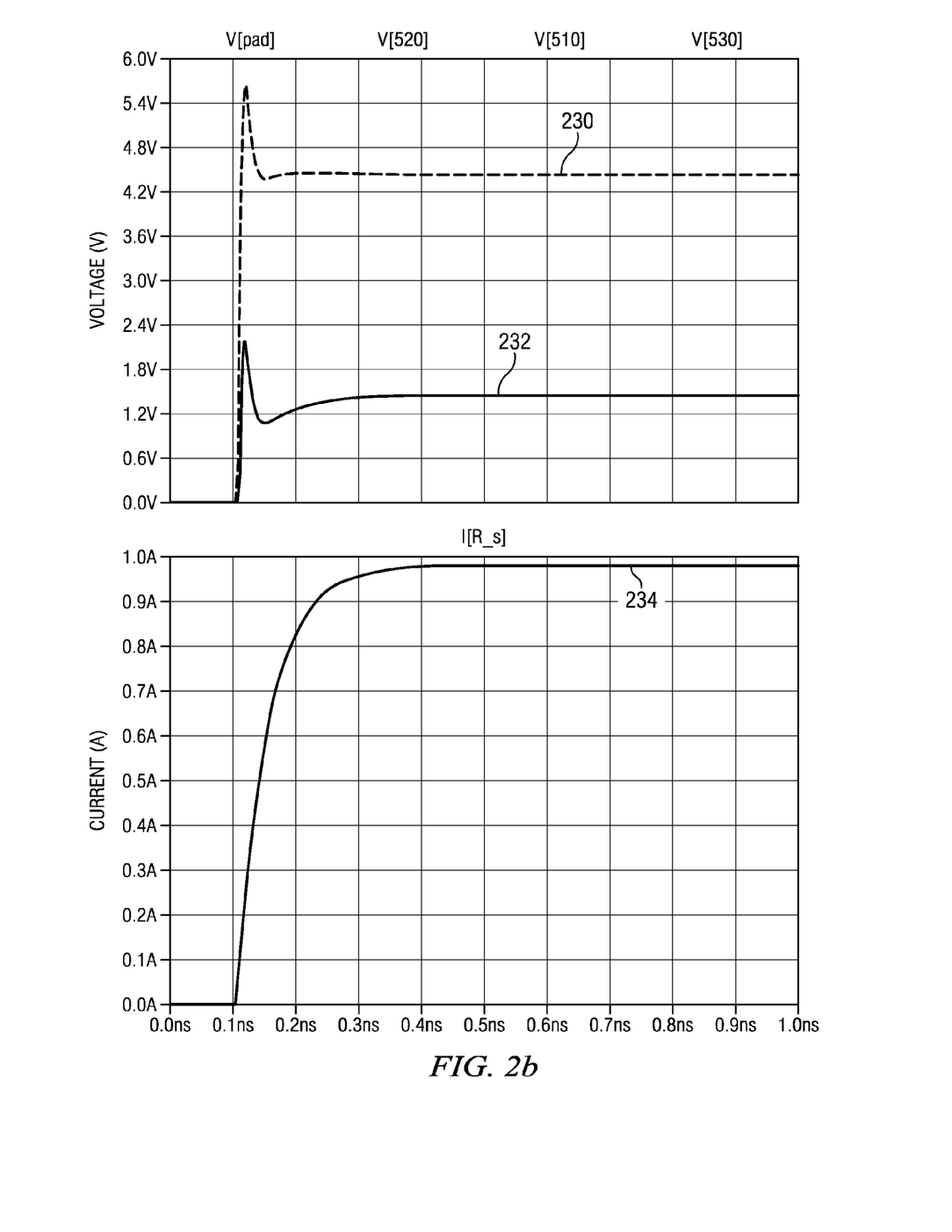

FIG. 2b illustrates a simulated waveform diagram showing the transient behavior of ESD circuit 130 (FIG. 1c) when power supply VDDP is pulsed with a high voltage. Curve 230 represents the supply voltage VDDP, curve 232 represents the voltage at intermediate node 102, and curve 234 represents current flowing between supply nodes VDDP and VSS. It can be seen that after 1 ns, VDDP is clamped to about 4.4V, intermediate node 102 assumes a value of 1.4V, and the current flowing from VDDP to VSS though the ESD device is about 980 mA. Alternatively, different performance may be seen depending on the particular embodiment and its specific implementation.

Figure 3A:
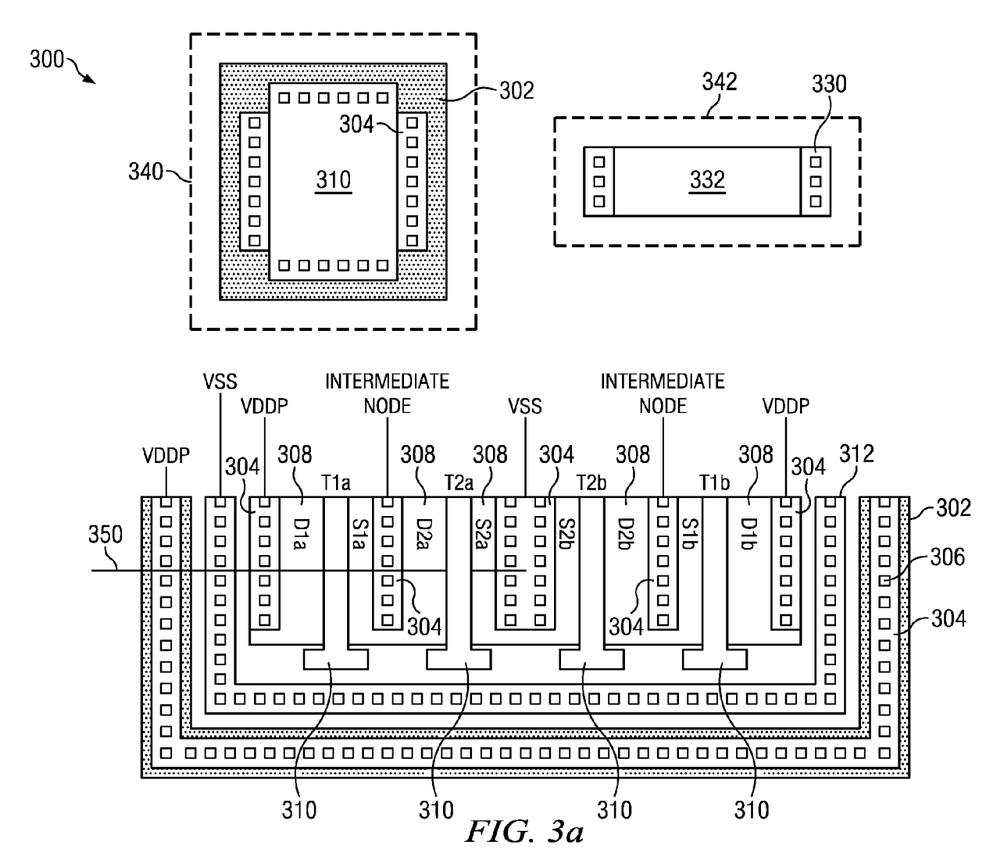
FIGS. 3a-3c illustrate a layout, cross-section, and equivalent circuit of an ESD device according to an embodiment of the present invention.

FIG. 3a illustrates a portion of embodiment layout 300, where transistors T1 and T2 are laid out in a joint layout style. In an embodiment, transistor T1 is split into T1a and T1b, and transistor T2 is split into T2a and T2b. Source S1a of T1a is shared with drain D2a of T2a, source S1b of T1b is shared with drain D2b of T2b, and source S2a of T2a is shared with source S2b of T2b. Each transistor has gate region 310 and n-type source/drain regions 308 having silicided contact regions 304 with contacts 306. In an embodiment, the transistors are surrounded by optional p-type guard ring of silicided p-type material 312, and optional n-type guard ring having n-well 302 contacted by silicided n-type regions 304. FIG. 3a illustrates a portion of these guard rings, however, in some embodiments; these guard rings can surround transistors T1a, T1b, T2a and T2b. In further embodiments, transistors T1 and T2 may be broken up to more than the two illustrated elements.

In an embodiment, drains D1a and D1b of transistors T1a and T1b are coupled to VDDP, sources S2a and S2b of transistors T2a and T2b are coupled to VSS, the p-type guard-ring is coupled to VSS, and the n-type guard ring is coupled to VDDP. The gates of transistors T1a, T1b, T2a and T2b are coupled to their respective capacitors and resistors. These above-mentioned connections are not illustrated in FIG. 3a for the simplicity of illustration, however, it should be understood that these connections could be made using, for example, metal lines and polysilicon lines using processes and techniques known in the art. In an embodiment, capacitor 340 is implemented as a n-well capacitor having gate region 310, and n-type bottom plate contacted by silicided n-type region 304 disposed in n-well 302. The dielectric of the gate region serves as the dielectric of the capacitor. Resistor 342 is implemented as a polysilicon resistor having silicided blocked polysilicon region 332 and silicided polysilicon contact region 330. The physical dimensions of capacitor 340 and resistor 310 are adjusted according to design values. FIG. 3a illustrates one example of a capacitor and one example of a resistor for simplicity of illustration, however, it should be understood that multiple instances of resistors and capacitors could be used to implement embodiment ESD devices. Furthermore, it should be understood that while the embodiment illustrated in FIGS. 3a and 3b illustrate ESD devices implemented using NMOS devices, other embodiments using PMOS devices could be implemented as well.

Figure 3B:
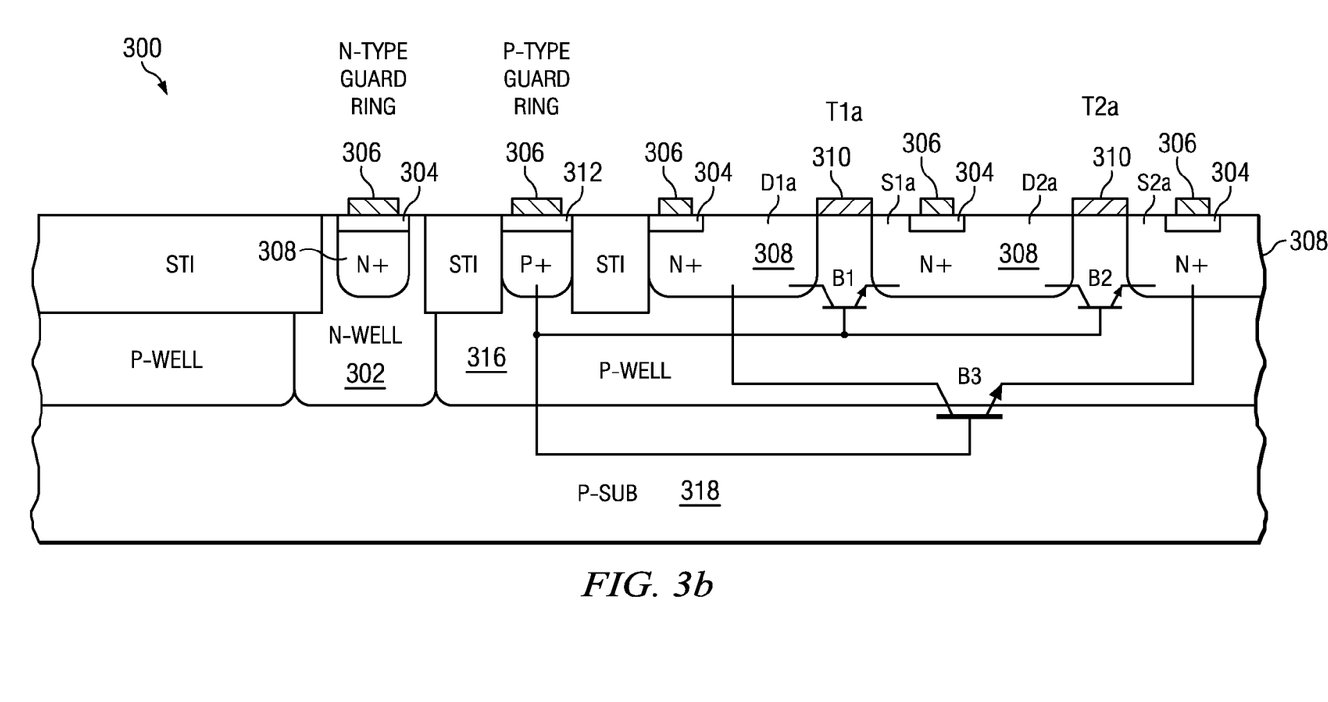

FIG. 3b illustrates cross section 350 of an embodiment ESD device corresponding to cross-section indicator line 350 shown in FIG. 3a. In an embodiment, n-type source/drain regions are made of n-type material 308 and are disposed within p-well 316 over p-type substrate 318, and the n-type guard ring is implemented by n-well 302. In an embodiment, n-type silicided regions 304 are disposed under contacts 306 leaving portions of source-drain regions free of silicide, thereby increasing the resistance of these regions. In an embodiment, these silicide-free regions are implemented by silicide blocking techniques known in the art. In alternative embodiments, the source/drain regions can be fully or partially silicided.

In an embodiment, the higher resistance of the silicide-blocked source/drain regions makes the ESD device more prone to conduction though parasitic bipolar devices B1 and B2 during an ESD event. In addition, due to the higher p-well and substrate resistance resulting from the distance from the ESD transistors to the grounded p-type guard ring, ESD current is also conducted by parasitic bipolar device B3 having a collector coupled to drain D1a of transistor T1a and an emitter coupled to source S2a of transistor T2a.

Figure 3C:
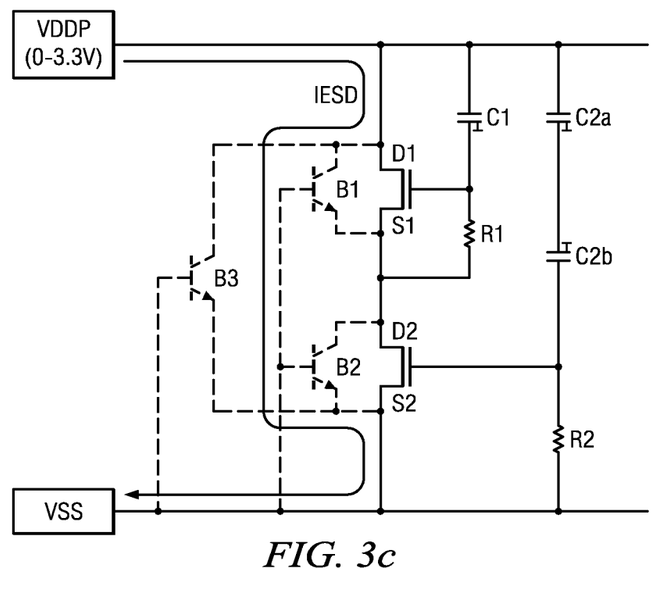

FIG. 3c illustrates an ESD current path for the ESD device layout of FIG. 3a showing current IESD flowing though parasitic bipolar device B3. In an embodiment, if stacked MOS devices T1 and T2 are triggered and the voltage at protected node VDDP continues to rise, T1 and T2 will become saturated. For sufficiently high voltages, parasitic bipolar devices B1 and B2 become activated and a new low-ohmic path to ground is created. At even higher voltages, parasitic bipolar transistor B3 triggers, which opens another parallel low-ohmic path to ground. If all the parallel current paths created by transistors T1, T2, B1, B2 and B3 become activated, the device reaches a minimum resistance and maximum current capability in some embodiments.

Figure 1D:
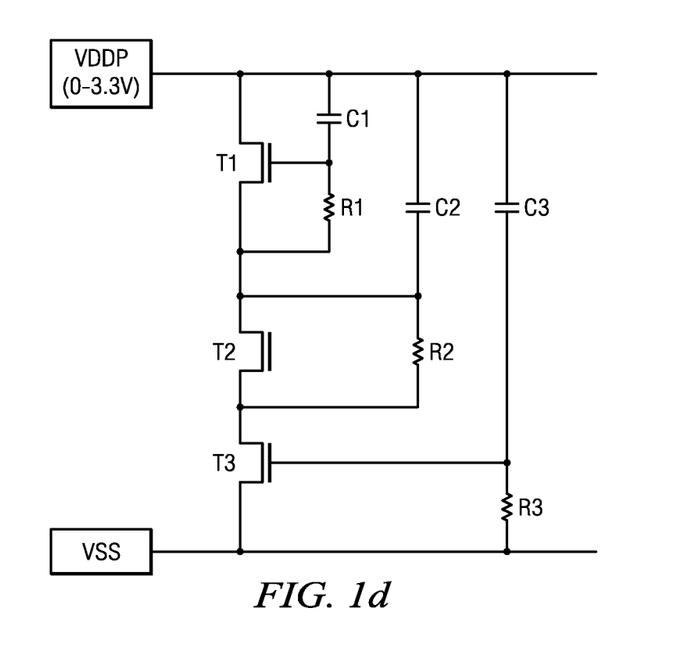
Figure 4A:
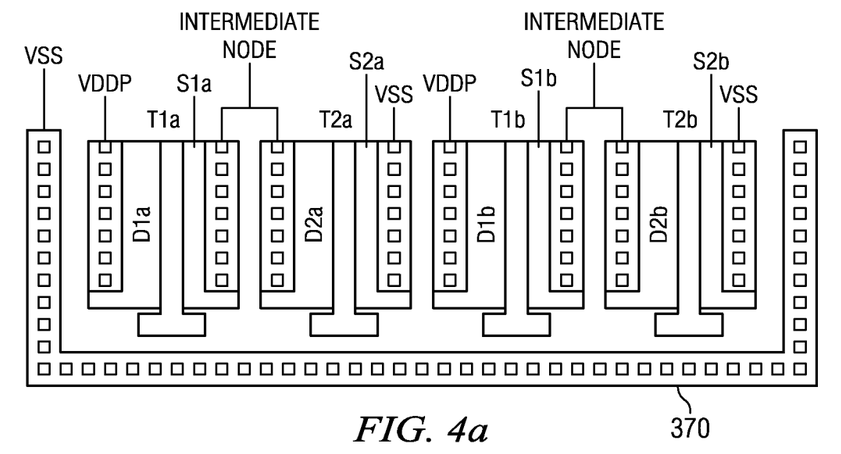
FIGS. 4a-4c illustrates layouts and an equivalent circuit of an ESD device according to another embodiment.
Figure 4B:
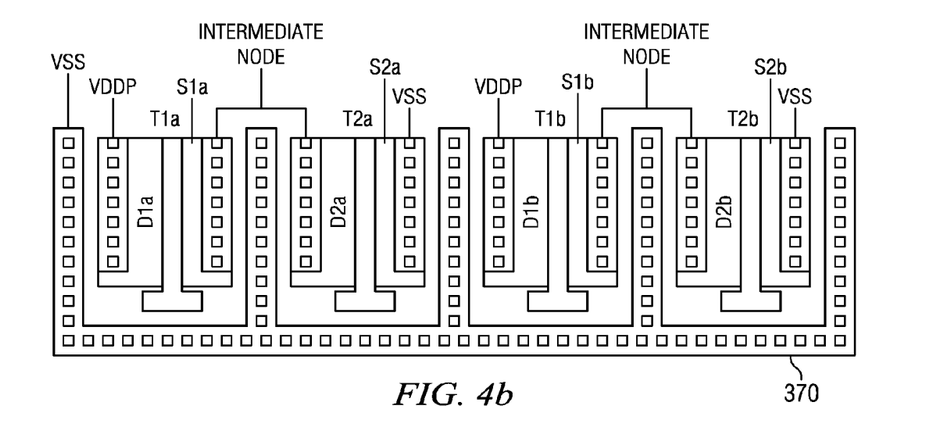
Figure 4C:
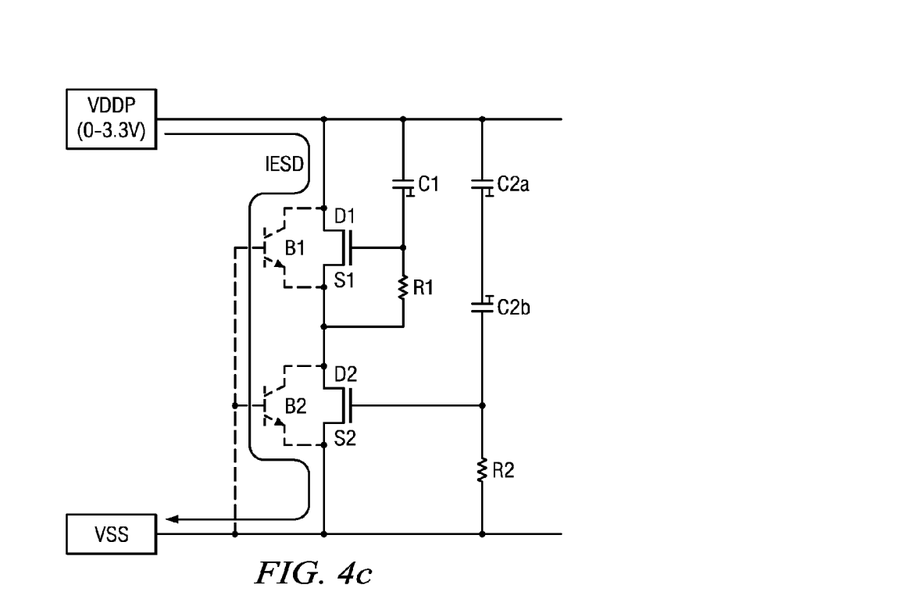

FIGS. 4a and 4b illustrate embodiment ESD device layouts in which stacked MOS devices T1a, T2a, T1b and T2b do not share source/drain regions. In FIG. 4a, each MOS device is laid out next to each other, while in FIG. 4a, each MOS device units is separated by p-type guard ring 370. In an embodiment, splitting up the MOS devices suppresses the effect of parasitic bipolar device B3, leaving parasitic bipolar devices B1 and B2 to remain. The effect of the additional guard ring portions between the two device units shown in FIG. 4b further suppresses the effect of the parasitic bipolar device B3. FIG. 4c illustrates a schematic representation of the ESD devices of embodiments of FIGS. 4a and 4b showing current IESD flowing through parasitic bipolar devices B1 and B2. It should be appreciated that while FIGS. 4a and 4b illustrate two stacked device units, greater than two stacked units can be implemented in alternative embodiments. For example, an embodiment having three stacked devices is shown in FIG. 1d.

Figure 5A:
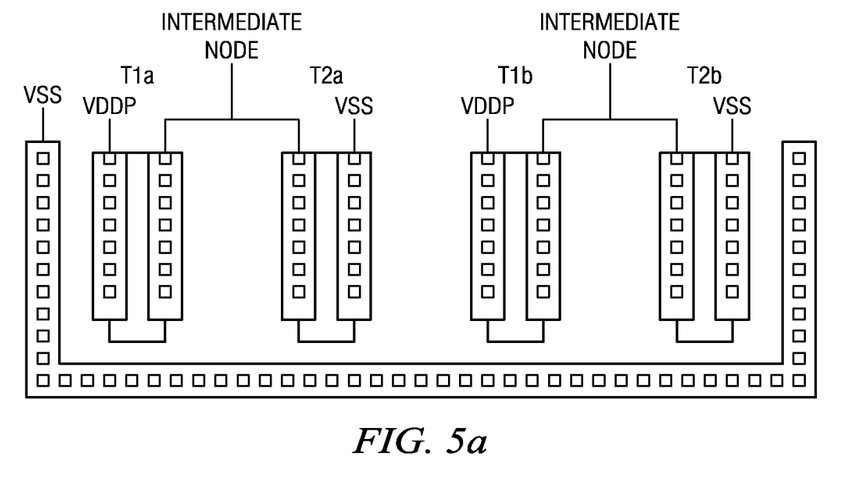
FIGS. 5a-5b illustrate a layout and equivalent circuit of an ESD according to a further embodiment.
Figure 5B:
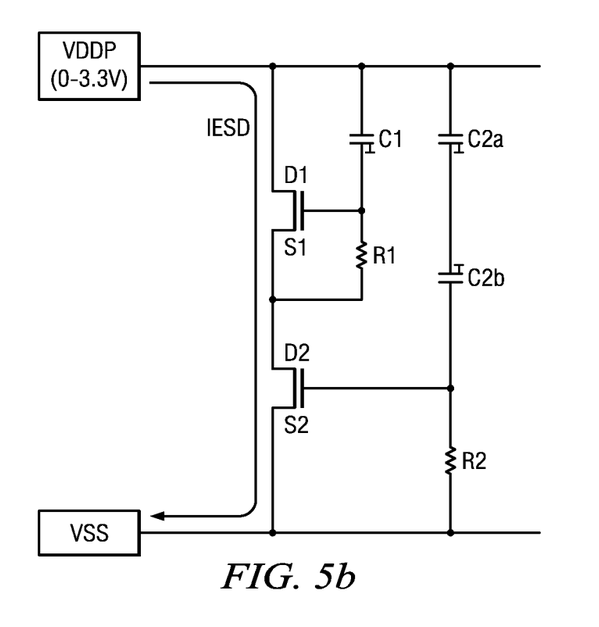

FIG. 5a illustrates an embodiment ESD device layout in which transistors T1a, T2a, T1b and T2b are separately laid out without sharing source and drain diffusions. Here, transistors T1a, T2a, T1b and T2b are separated by a greater distance than the devices illustrated in FIG. 4a. In an embodiment, further separating the individual devices suppresses the effect of parasitic bipolar devices B1 and B2, such that ESD current is primarily conducted by the MOS channels of transistors T1a, T2a, T1b and T2b during an ESD event. In one embodiment, the source/drain regions of transistors T1a, T2a, T1b and T2b are fully silicided, and the length between source/drain contacts and the gates of the devices is shortened to reduce the source/drain resistances. In this embodiment, single contacts are placed at chosen locations in the source/drain regions of transistors T1a, T2a, T1b and T2b to provide voltage bias of T1 gate from intermediate node 102. FIG. 5b illustrates a schematic representation of the ESD device of the embodiment FIG. 5a showing current IESD flowing though transistors T1 and T2. In some embodiments in which the parasitic bipolar effect is suppressed, the MOS devices of the ESD devices are sized larger in order to conduct an equivalent amount of current as an ESD device in which the parasitic bipolar effect is not suppressed.

Figure 6A:
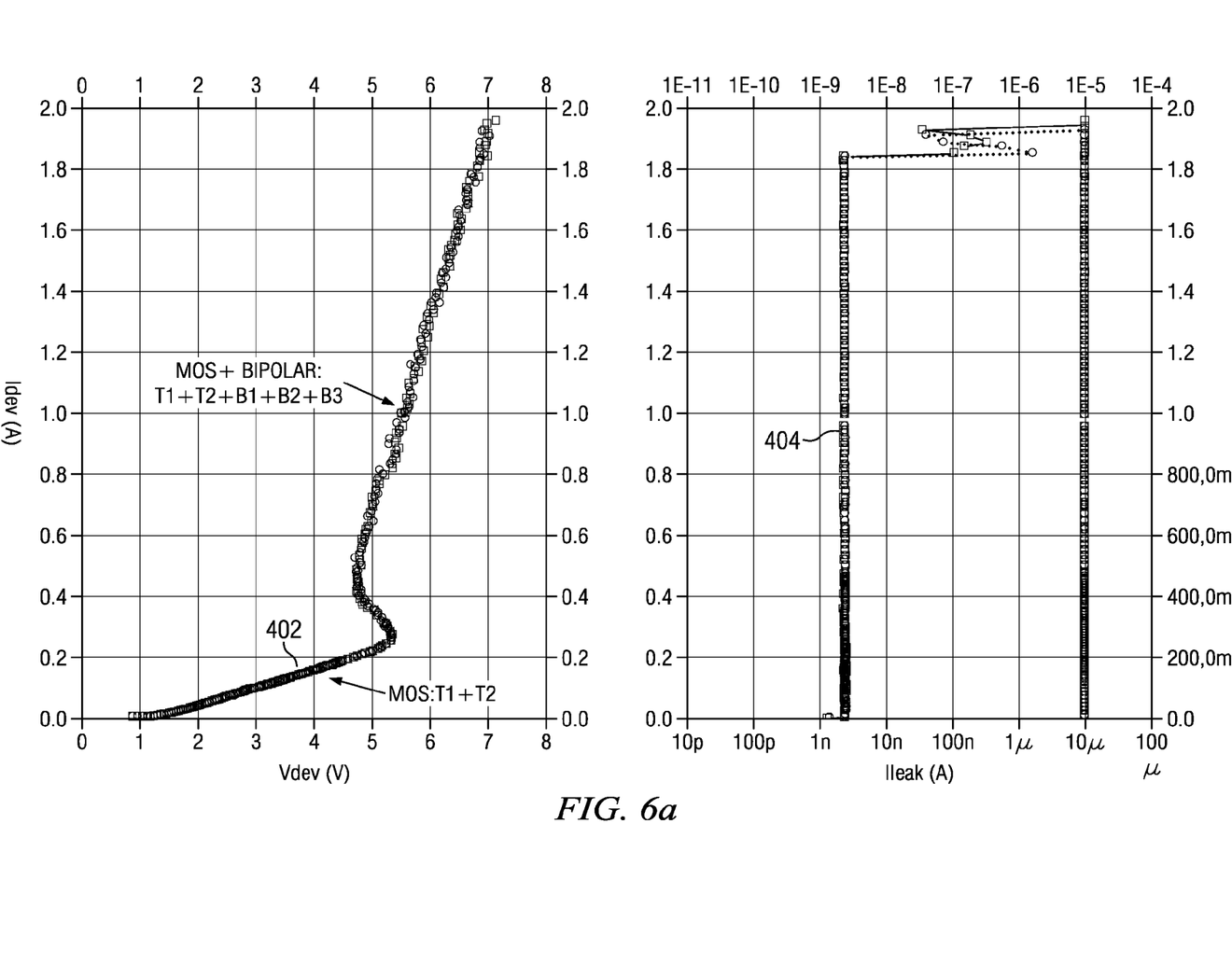
FIGS. 6a-6b illustrate graphs showing the performance of an embodiment ESD device.

FIG. 6a illustrates a TLP characterization of an embodiment device according to the embodiment of FIGS. 3a-3c. Here, the device is pulsed with a 100 ns wide pulse having a 10 ns rising and falling edge. Curve 402 represents the pulse current though the ESD device with respect to applied voltage. As the applied input voltage is increased up to about 5.4 V, most of the conduction occurs in the channels of transistors T1 and T2. As the voltage is increased beyond 5.4 V, parasitic transistors B1, B2 and B3 start conducting, thereby allowing for a higher current though the ESD device. Curve 404 represents DC leakage current with respect to applied TLP current pulse. It can be seen that the initial leakage is less than 10 nA at 3.3V for this particular embodiment. The leakage stays stable up to pulse currents of over 1.8 Å. Then the maximum current capability is reached and the device eventually fails with thermal destruction, which becomes visible as a strong and sudden increase in leakage. In alternative embodiments of the present invention, different embodiments may have different performance characteristics.

Figure 6B:
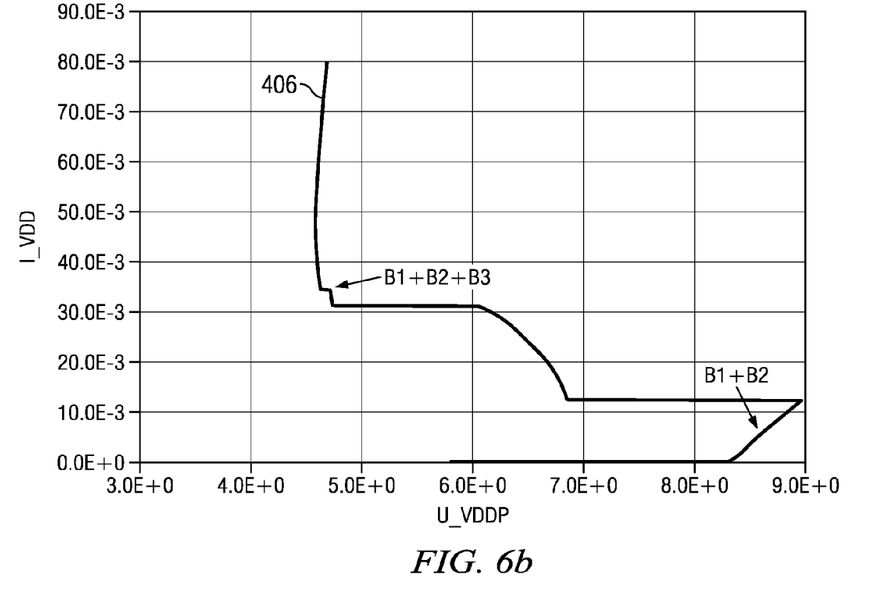

FIG. 6b illustrates a DC characterization of an ESD device according to the embodiment of FIGS. 3a-3c. Trace 406 represents output current with respect to applied DC voltage. It can be seen that the ESD device begins to conduct DC current at an applied voltage of about 8.4 V when transistors T1 and T2 begin to break down. Because the of the DC blocking characteristics of capacitors C1, C2a and C2b, the gate voltages of transistors T1 and T2 are not pulled high. Therefore, compared to the case of a pulsed voltage, a higher DC voltage can be applied across the ESD device before the ESD device conducts current in this embodiment.

Figure 7:
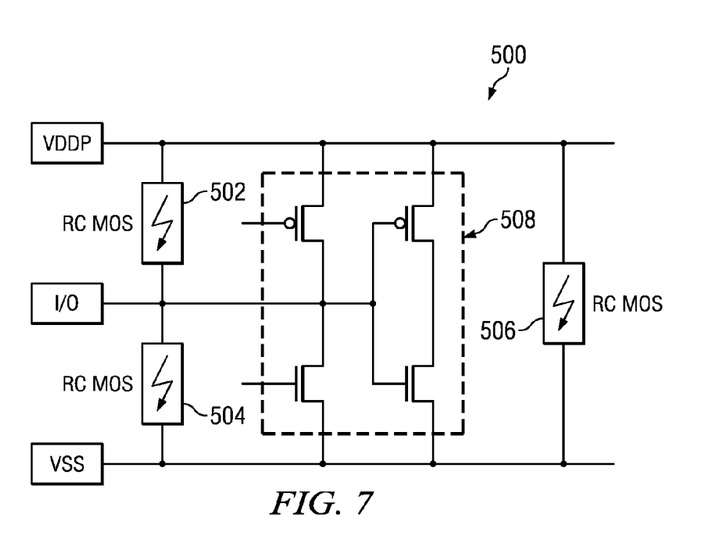
FIG. 7 illustrates an embodiment application example for embodiment ESD devices.

FIG. 7 illustrates an implementation example of embodiment ESD clamps that protect I/O buffer 508. Embodiment ESD clamps 502 and 504 are coupled between supply pin VDDP an input pin I/O, and between input pin I/O and supply pin VSS, respectively. Embodiment ESD clamp 506 is coupled between supply pin VDDP and supply pin VSS. It should be appreciated that the embodiment of FIG. 7 is an illustration one implementation example of embodiment ESD clamp circuits. Embodiment ESD structures can be used to protect I/O, supply nodes and on-chip circuitry using many different structures, architectures and configurations. In alternative embodiments, further ESD protection circuits can be implemented in addition to embodiment ESD clamps.

Advantages of embodiments include the ability to use low voltage devices having voltage ratings lower than a nominal operating voltage. With respect to capacitors that trigger the MOS devices, using a low voltage device such as an NMOS capacitor is advantageous in that these low voltage devices have a thinner oxide and a higher per unit capacitance. In some embodiments, a stacked ESD can be implemented using devices that possess a maximum voltage two times smaller than the voltage of the protected node. As such, less area needs to be devoted to the trigger capacitors. In some embodiments, the NMOS capacitor occupies fewer metal layers then an equivalent metal capacitor, thereby allowing more freedom in routing.

A further advantage of some embodiments includes low trigger current stemming from the ESD structure's simple topology. In some embodiments, the trigger current is low because of the low capacitance of the ESD trigger circuit. Another advantage of embodiments includes a low trigger voltage, which is about the threshold of the stacked MOS devices. A further advantage includes a low risk of oscillation when the device is under normal operation, especially during a power ramp-up.

Another advantage of embodiment ESD devices includes the ability for a designer to optimize the MOS trigger circuit for speed in the charged device model (CDM) regime. For example, an embodiment device can be optimized to provide about a 10 Å ESD current given about a 100 ps rise time. A further advantage of some embodiments includes the ability to fabricate an embodiment ESD device using no additional process steps and no ESD implants. Another advantage includes the ability to use devices from the same process technology (i.e. CMOS) to fabricate ESD device. A further advantage includes flexibility in layout for routing. In some embodiments, using an auxiliary voltage for reliability reasons is not required.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

FIGS. 4a and 4b illustrate embodiment ESD device layouts in which stacked MOS devices T1a, T2a, T1b and T2b do not share source/drain regions. In FIG. 4a, each MOS device is laid out next to each other, while in FIG. 4a, each MOS device unit is separated by p-type guard ring 370. In an embodiment, splitting up the MOS devices suppresses the effect of parasitic bipolar device B3, leaving parasitic bipolar devices B1 and B2 to remain. The effect of the additional guard ring portions between the two device units shown in FIG. 4b further suppresses the effect of the parasitic bipolar device B3. FIG. 4c illustrates a schematic representation of the ESD devices of embodiments of FIGS. 4a and 4b showing current IESD flowing through parasitic bipolar devices B1 and B2. It should be appreciated that while FIGS. 4a and 4b illustrate two stacked device units, greater than two stacked units can be implemented in alternative embodiments. For example, an embodiment having three stacked devices is shown in FIG. 1d.

What is claimed is:

1. An electrostatic discharge (ESD) circuit comprising:
a first MOS device having a first source/drain coupled to a first node, and a second source/drain coupled to an intermediate node;
a first capacitor coupled between a gate of the first MOS device and the first node;
a first resistor coupled between the gate of the first MOS device and the intermediate node;
a second MOS device having a first source/drain coupled to the intermediate node, and a second source/drain coupled to a second node, wherein the first node, the second node and the intermediate node are separate nodes, and the first MOS device has a same polarity type as the second MOS device;
a second capacitor coupled between a gate of the second MOS device and the first node; and
a second resistor coupled between the gate of the second MOS device and the second node, wherein the ESD circuit is configured to provide protection between the first node and the second node, wherein the intermediate node only has operative direct connections to the first MOS device, the second MOS device, the first resistor, and parasitic bipolar devices of the ESD circuit.

2. The ESD circuit of claim 1, wherein current is shunted through a parasitic bipolar device coupled between the first source/drain of the first MOS device and the second source/drain of the second MOS device.

3. The ESD circuit of claim 1, wherein:
the first capacitor comprises a first capacitance; and
the second capacitor comprises a series combination of two capacitors of a second capacitance.

4. The ESD circuit of claim 1, wherein an RC time constant of the first capacitor and the first resistor is between about 10 ns and 1000 ns.

5. The ESD circuit of claim 1, wherein the first MOS device and the second MOS device comprise low voltage NMOS devices.

6. The ESD circuit of claim 1, wherein the first MOS device and the second MOS device comprise separately laid out devices, wherein an ESD current flows primarily through a channel of the first MOS device and a channel of the second MOS device.

7. The ESD circuit of claim 1, wherein a first portion of the second source/drain of the first MOS device, a first portion the first source/drain of the second MOS device, and a first portion of the second source/drain of the second MOS device comprise a first common source/drain region and form a first stacked device unit, wherein an ESD current flows primarily through a first parasitic bipolar device coupled between the first and second source/drain of the first MOS device and through a second parasitic bipolar device coupled between the first source/drain of the second MOS device and the second source/drain of the second MOS device.

8. The ESD circuit of claim 7, wherein a second portion of the second source/drain of the second MOS device form a portion of a second stacked device unit disposed adjacent to the first stacked device unit, wherein:
the first portion of the second source/drain of the second MOS device of the first stacked device unit and the second portion of the second source/drain of the second MOS device of the second stacked device unit form a second common source/drain region; and
ESD current further flows through a third parasitic bipolar device coupled between the portions of the first source/drains of the first MOS device of the first and second stacked device units and the second common source/drain region.

9. The ESD circuit of claim 7, wherein at least a portion of the first common source/drain region of the first stacked device unit does not have silicide disposed over it.

10. The ESD circuit of claim 1, wherein the same polarity type comprises NMOS.

11. The ESD circuit of claim 1, wherein the intermediate node is configured to float when the first MOS device and the second MOS device are shut off.

12. A method of operating a semiconductor circuit protection device comprising a first MOS device having a first source/drain coupled to a first protected node and a second source/drain coupled to an intermediate node, a first capacitor coupled between a gate of the first MOS device and the first protected node, a first resistor coupled between the gate of the first MOS device and the intermediate node, a second MOS device having a first source/drain coupled to the intermediate node, and a second source/drain coupled to a second protected node, a second capacitor coupled between a gate of the second MOS device and the first protected node, and a second resistor coupled between the gate of the second MOS device and the second protected node, wherein the first protected node, the second protected node and the intermediate node are separate nodes, the first MOS device has a same polarity type as the second MOS device, and the method comprises:
protecting circuitry coupled to the first and second protected node from a fast transient voltage on the first protected node, protecting comprising
coupling the fast transient voltage to the gate of the first MOS device via the first capacitor,
coupling the fast transient voltage to the gate of the second MOS device via the second capacitor, and
shunting a current through the protection device from the first protected node to the second protected node, wherein the intermediate node only has operative direct connections to the first MOS device, the second MOS device, the first resistor, and parasitic bipolar devices of the semiconductor circuit protection device.

13. The method of claim 12, wherein shunting the current further comprises shunting the current through a first parasitic bipolar device coupled between the first source/drain of the first MOS device and the second source/drain of the first MOS device, and through a second parasitic bipolar device coupled between the first source/drain of the second MOS device and the second source/drain of the second MOS device.

14. The method of claim 12, wherein shunting the current further comprises shunting the current through a parasitic bipolar device coupled between the first source/drain of the first MOS device and the second source/drain of the second MOS device.

15. The method of claim 12, further comprising biasing the first and second MOS devices within maximum rated voltages using a self-generated bias source coupled to the intermediate node.

16. The method of claim 15, further comprising applying a first normal operating voltage across the first and second protected nodes, wherein
the first normal operating voltage exceeds the maximum rated voltages of the first and second MOS devices; and
voltages across the first and second MOS devices are maintain within the maximum rated voltages when the first normal operating voltage is applied between the first and second protected node.

17. The method of claim 12, wherein the same polarity type comprises NMOS.

18. The method of claim 12, further comprising floating the intermediate node when the first MOS device and the second MOS device are shut off.

19. An electrostatic discharge (ESD) circuit comprising:
a first transistor device having a first output terminal coupled to a first node, and a second output terminal coupled to an intermediate node;
a first capacitor coupled between a control terminal of the first transistor device and the first node;
a first resistor coupled between the control terminal of the first transistor device and the intermediate node;
a second transistor device having a first output coupled to the intermediate node, and a second output terminal coupled to a second node, wherein the first node, the second node and the intermediate node are separate nodes, and the intermediate node is configured to float when the first transistor device and the second transistor device are shut off;
a second capacitor coupled between a control terminal of the second transistor device and the first node; and
a second resistor coupled between the control terminal of the second transistor device and the second node, wherein the ESD circuit is configured to provide protection between the first node and the second node, wherein the intermediate node only has operative direct connections to the first transistor device, the second transistor device, the first resistor, and parasitic bipolar devices of the ESD circuit.

20. The ESD circuit of claim 19, wherein the first transistor device comprises a first NMOS transistor and the second transistor device comprises a second NMOS transistor.

21. The ESD circuit of claim 19, wherein a first portion of the second output terminal of the first transistor device, a first portion of the first output terminal of the second transistor device, and a first portion of the second output terminal of the second transistor device comprise a first common terminal and form a first stacked device unit, wherein an ESD current flows primarily through a first parasitic bipolar device coupled between the first and second output terminals of the first transistor device and through a second parasitic bipolar device coupled between the first output terminal of the second transistor device and the second output terminal of the second transistor device.

22. The ESD circuit of claim 21, wherein a second portion of the second output terminal of the second transistor device, and a second portion of the first output terminal of the first transistor device forms a second stacked device unit disposed adjacent to the first stacked device unit wherein the first portion of the second output terminal of the second transistor device of the first stacked device unit and the second portion of the second output terminal of the second transistor device of the second stacked device unit form a second common terminal such that ESD current further flows through a third parasitic bipolar device coupled between the portions of the first output terminals of the first transistor device of the first and second stacked device units and the second common terminal.

23. The ESD circuit of claim 19, wherein the first transistor device and the second transistor device have a same polarity type.

* * * * *